(12) United States Patent
Ng et al.

(10) Patent No.: US 10,483,446 B2
(45) Date of Patent: Nov. 19, 2019

(54) ELECTRONIC DEVICE

(71) Applicant: OSRAM Opto Semiconductors GmbH, Regensburg (DE)

(72) Inventors: Kok Eng Ng, Air Itam (MY); Wui Chai Chew, Bayan Lepas (MY); Choo Kean Lim, Penang (MY); Mardiana Khalid, Balik Pulau (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/750,316

(22) PCT Filed: Aug. 6, 2015

(86) PCT No.: PCT/EP2015/068158
§ 371 (c)(1),
(2) Date: Feb. 5, 2018

(87) PCT Pub. No.: WO2017/020958
PCT Pub. Date: Feb. 9, 2017

(65) Prior Publication Data
US 2018/0226555 A1    Aug. 9, 2018

(51) Int. Cl.
*H01L 21/48* (2006.01)
*H01L 33/64* (2010.01)
(Continued)

(52) U.S. Cl.
CPC ........ *H01L 33/647* (2013.01); *H01L 21/4846* (2013.01); *H01L 23/3735* (2013.01);
(Continued)

(58) Field of Classification Search
CPC .......................... H01L 33/647; H01L 21/4846
See application file for complete search history.

(56) References Cited

U.S. PATENT DOCUMENTS

2008/0246052 A1* 10/2008 Hsu ..................... H01L 23/3735
257/99
2009/0040418 A1*  2/2009 Kao ..................... H01L 33/641
349/61
(Continued)

FOREIGN PATENT DOCUMENTS

DE    10 2009 031 109 A1    8/2010
JP        2007-067190 A      3/2007
(Continued)

OTHER PUBLICATIONS

Lee, J. et al., "Thermal conductivity of anodized aluminum oxide layer: The effect of electrolyte and temperature", *Materials Chemistry and Physics*, 2013, vol. 141, No. 2, pp. 680-685.
(Continued)

*Primary Examiner* — Mohammad M Choudhry
(74) *Attorney, Agent, or Firm* — DLA Piper LLP (US)

(57) ABSTRACT

An electronic device includes a carrier and a semiconductor chip, wherein the carrier includes a first dielectric layer and a second dielectric layer, a thermal conductivity of the first dielectric layer exceeds a thermal conductivity of the second dielectric layer, the second dielectric layer is arranged on the first dielectric layer and partially covers the first dielectric layer, the semiconductor chip is arranged on the carrier in a mounting area in which the first dielectric layer is not covered by the second dielectric layer, and the carrier includes a solder terminal for electrical contacting arranged on the second dielectric layer.

20 Claims, 5 Drawing Sheets

(51) Int. Cl.
  *H01L 23/373* (2006.01)
  *H01L 23/498* (2006.01)
  *H01L 23/538* (2006.01)
  *H01L 23/00* (2006.01)
  *H01L 25/075* (2006.01)
  *H01L 33/62* (2010.01)
  *H01L 33/50* (2010.01)

(52) U.S. Cl.
  CPC .... *H01L 23/49811* (2013.01); *H01L 23/5386* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 25/0753* (2013.01); *H01L 33/62* (2013.01); *H01L 33/641* (2013.01); *H01L 33/50* (2013.01); *H01L 2224/32225* (2013.01); *H01L 2224/48091* (2013.01); *H01L 2224/48101* (2013.01); *H01L 2224/48106* (2013.01); *H01L 2224/48137* (2013.01); *H01L 2224/48227* (2013.01); *H01L 2224/73265* (2013.01); *H01L 2224/85801* (2013.01); *H01L 2224/92247* (2013.01); *H01L 2924/12041* (2013.01); *H01L 2933/0066* (2013.01)

(56) References Cited

U.S. PATENT DOCUMENTS

2011/0278624 A1  11/2011  Nam
2013/0009183 A1   1/2013  Han
2014/0284651 A1   9/2014  Tsuchiya et al.

FOREIGN PATENT DOCUMENTS

JP  2012-517697 A   8/2012
JP  2013-149843 A   8/2013
JP  2014-187305 A  10/2014

OTHER PUBLICATIONS

Shamsa, M. et al., "Thermal conductivity of diamond-like carbon films", *Applied Physics Letters*, American Institute of Physics, 2006, vol. 89, No. 16, pp. 161921-1-161921-3.

Notice of Reasons for Rejection dated Dec. 25, 2018, of counterpart Japanese Application No. 2018-503193, in English.

\* cited by examiner

ELECTRONIC DEVICE

TECHNICAL FIELD

This disclosure relates to an electronic device comprising a carrier and a semiconductor chip as well as a method of producing an electronic device.

BACKGROUND

An electronic device may be realized in the form of a so-called chip-on-board module (COB) comprising a carrier and one or several semiconductor chips arranged on the carrier. An optoelectronic device that generates light radiation configured in this way may comprise radiation-emitting semiconductor chips such as LED chips (light emitting diode).

Common COB devices comprise solder pads to which wires may be connected by soldering for electrical contacting. Another approach consists of using a secondary housing with mechanical contact structures. That approach is however associated with higher costs.

With respect to a COB device with solder pads, drawbacks may arise, as well. This is because the carrier may be designed such that heat generated during operation of the electronic device may be efficiently removed. Using such a carrier therefore has the effect that removal of heat also appears during a COB soldering process. As a consequence, it is difficult to provide and maintain an appropriate temperature for soldering in the area of the solder pads, thus making it difficult to control the soldering process and the achievable soldering quality.

For this reason, the soldering process is usually not conducted in an automated manner but instead in a manual way, wherein an operator with good skills is preferred for carrying out the soldering. Nevertheless, the soldering quality may be poor so that issues regarding the solder joint reliability may arise. It is, for example, possible that a solder joint comprises a void and/or is insecure.

To overcome those problems, a conventional approach consists of applying a hot plate for a COB soldering process so that an appropriate soldering temperature may be provided and maintained. This approach is however time-consuming.

It could therefore be helpful to provide an improved electronic device to which a wire may be connected by soldering without the above-identified problems along with a method of producing such an electronic device.

SUMMARY

We provide an electronic device including a carrier and a semiconductor chip, wherein the carrier includes a first dielectric layer and a second dielectric layer, a thermal conductivity of the first dielectric layer exceeds a thermal conductivity of the second dielectric layer, the second dielectric layer is arranged on the first dielectric layer and partially covers the first dielectric layer, the semiconductor chip is arranged on the carrier in a mounting area in which the first dielectric layer is not covered by the second dielectric layer, and the carrier includes a solder terminal for electrical contacting arranged on the second dielectric layer.

We also provide a method of producing the electronic device including a carrier and a semiconductor chip, wherein the carrier includes a first dielectric layer and a second dielectric layer, a thermal conductivity of the first dielectric layer exceeds a thermal conductivity of the second dielectric layer, the second dielectric layer is arranged on the first dielectric layer and partially covers the first dielectric layer, the semiconductor chip is arranged on the carrier in a mounting area in which the first dielectric layer is not covered by the second dielectric layer, and the carrier includes a solder terminal for electrical contacting arranged on the second dielectric layer, including: providing a first dielectric layer; providing a second dielectric layer, wherein a thermal conductivity of the first dielectric layer exceeds a thermal conductivity of the second dielectric layer; arranging the second dielectric layer on the first dielectric layer so that a carrier is produced, wherein the carrier includes a mounting area in which the first dielectric layer is not covered by the second dielectric layer; providing a solder terminal arranged on the second dielectric layer; and arranging a semiconductor chip on the carrier in the mounting area.

Figure 1:
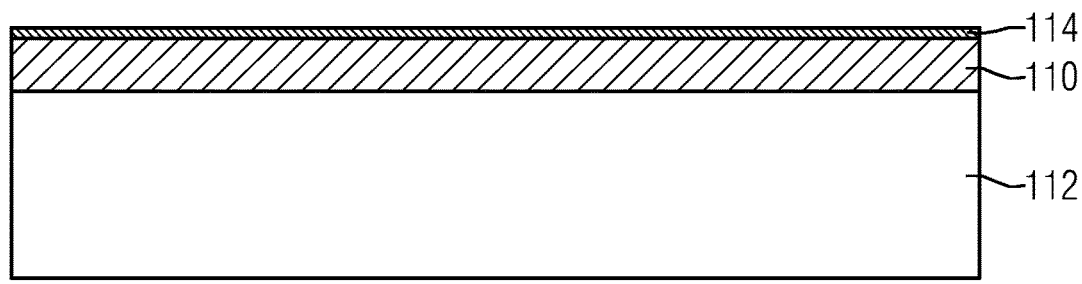
FIGS. 1 to 7 show fabrication of a carrier of an electronic device, wherein the carrier comprises two dielectric layers with different thermal conductivities and two solder pads.

REFERENCE NUMBERS 100 device
105 carrier
107 mounting area
110 first dielectric layer
112 metal base layer
114 metallic layer
116 mounting pad
120 second dielectric layer
121 opening
124 metallic layer
125 contact layer
126 solder pad
127 contact area
130 covering layer
140 semiconductor chip
142 bond wire
150 frame structure
151 embedding material
160 wire
161 solder

DETAILED DESCRIPTION

We provide an electronic device comprising a carrier and a semiconductor chip. The carrier comprises a first dielectric layer and a second dielectric layer. A thermal conductivity of the first dielectric layer exceeds a thermal conductivity of the second dielectric layer. The second dielectric layer is arranged on the first dielectric layer and partially covers the first dielectric layer. The semiconductor chip is arranged on the carrier in a mounting area in which the first dielectric layer is not covered by the second dielectric layer. The carrier comprises a solder terminal for electrical contacting. The solder terminal is arranged on the second dielectric layer.

The electronic device may be a so-called chip-on-board module (COB). The electronic device comprises a carrier with a first and a second dielectric layer. The two dielectric layers comprise different thermal conductivities. This configuration makes it possible to provide effective removal of heat during operation of the electronic device as well as to promote and enhance a soldering process carried out to contact the electronic device.

In this context, a semiconductor chip is arranged on the carrier in a mounting area in which the first dielectric layer with the higher thermal conductivity is not covered by the second dielectric layer. Consequently, heat produced during operation of the semiconductor chip may be efficiently conducted away from the semiconductor chip via the first dielectric layer.

For the purpose of electrical contacting, the carrier comprises a solder terminal to which a wire may be connected by soldering. The solder terminal is arranged on the second dielectric layer with the lower thermal conductivity. This makes it possible to reliably provide and maintain an appropriate soldering temperature in the area of the solder terminal because a removal of heat may be suppressed or, respectively, reduced in this area. Consequently, the soldering process may be carried out with a high process quality, and a reliable and stable solder joint may be formed. This has the effect that the yield and also the efficiency when operating the electronic device may be improved. The high soldering quality makes it furthermore possible to conduct the soldering process in an automated and therefore cost-efficient manner. Moreover, application of a hot plate may be avoided.

In the following, further possible examples of our electronic device are described.

The first dielectric layer may comprise a thermal conductivity with a minimum value of 10 W/mK. The thermal conductivity of the first dielectric layer may, for example, be 10 W/mK to 20 W/mK. The second dielectric layer may comprise a thermal conductivity with a maximum value of 5 W/mK. The thermal conductivity of the second dielectric layer may, for example, be below 2 W/mK or below 1 W/mK. In this way, the electronic device may reliably feature an effective removal of heat during operation of the electronic device as well as enable soldering with a high quality.

It is also possible to apply dielectric layers or, respectively, dielectric materials for the same having thermal conductivities different from the above-mentioned numerical data. As an example, the first dielectric layer may comprise a thermal conductivity of 3.0 W/mK. In this regard, the second dielectric layer may comprise a thermal conductivity of, for example, 1.3 W/mK.

Each of the two dielectric layers may comprise or, respectively, be made of a respective dielectric material. An example is a composite material such as a resin based composite material.

The second dielectric layer may comprise an opening by which the mounting area is provided. This example allows for a symmetric configuration of the electronic device in which the opening and therefore the mounting area may be located centrally on the carrier.

The carrier may comprise a mounting pad arranged on the first dielectric layer in the mounting area, and the semiconductor chip is arranged on the mounting pad. In this way, the semiconductor chip may be reliably attached to the carrier, and heat produced when operating the semiconductor chip may be efficiently transferred from the semiconductor chip to the first dielectric layer via the mounting pad.

The mounting pad of the carrier may comprise a metal such as copper. The mounting pad may furthermore comprise a metallic plating. The semiconductor chip may be attached to the mounting pad by a bonding material such as an adhesive.

The carrier may comprise a metal base layer on which the first dielectric layer is arranged. In this way, removal of heat during operation of the electronic device may be promoted because the metal base layer may act as a heat sink. Moreover, it is possible to arrange the electronic device or, respectively, the metal base layer of the carrier on an additional heat sink so that heat transfer from the metal base layer to the additional heat sink may occur, thus further promoting removal of heat during operation of the electronic device. The carrier comprising the metal base layer may be a so-called metal core printed circuit board (MCPCB). The metal base layer may, for example, be an aluminum layer.

With regard to the solder terminal of the carrier, the following examples may be considered. The solder terminal may be configured in the form of a layer or, respectively, solder pad. The solder terminal may comprise a metal such as copper. The solder terminal may furthermore comprise a metallic plating.

The carrier may comprise a contact layer arranged on the second dielectric layer and a covering layer arranged on the contact layer and partially covering the contact layer. The solder terminal is provided by a region of the contact layer not covered by the covering layer. By the covering layer, impairment of the contact layer such as corrosion may be suppressed. The covering layer may comprise an insulating material, and may constitute a solder mask located on the carrier. The contact layer may comprise a metal such as copper. In the region constituting the solder terminal, the contact layer may additionally comprise a metallic plating.

The contact layer may comprise a further region not covered by the covering layer, and may provide a contact area. An electrical connection structure such as a bond wire may be attached to the contact area and the semiconductor chip. In this way, the semiconductor chip may be electrically connected to the solder terminal. In the region constituting the contact area, the contact layer may additionally comprise a metallic plating, as well.

The carrier may also comprise a further solder terminal arranged on the second dielectric layer for electrical contacting. In this way, the carrier may comprise two solder terminals arranged on the second dielectric layer to which wires may be connected by soldering. Arrangement of the two solder terminals on the second dielectric layer with the lower thermal conductivity makes it possible to provide and maintain an appropriate soldering temperature in the area of the solder terminals.

The two solder terminals may constitute a cathode terminal and an anode terminal of the electronic device, thus making it possible to supply electrical energy to the electronic device to operate the same. The above-described examples relating to a solder terminal may correspondingly apply to the configuration with two solder terminals.

Accordingly, the two solder terminals may each be realized in the form of a solder pad. The carrier may comprise two separate contact layers arranged on the second dielectric layer. The carrier may either comprise a common covering layer or two separate covering layers assigned to the two contact layers by which the two contact layers are partially covered. The two solder terminals may be provided by respective regions of the two contact layers not covered by the covering layer(s). Moreover, two contact areas may be provided by further regions of the two contact layers not covered by the covering layer(s). In the regions constituting the solder terminals and the further regions constituting the contact areas, the contact layers may comprise a metallic plating. Electrical connection structures such as bond wires may be attached to the two contact areas and the semiconductor chip. In this way, the semiconductor chip may be electrically connected to the two contact areas.

The electronic device may be an optoelectronic device. In an example like this, the semiconductor chip is an optoelectronic semiconductor chip.

It is furthermore possible that the electronic device is an optoelectronic device that generates light radiation. For this purpose, a radiation-emitting or, respectively, light-emitting semiconductor chip may be applied. In this regard, the above-mentioned mounting pad on which the semiconductor chip may be arranged may additionally provide an efficient reflection of light. The radiation-emitting semiconductor chip may, for example, be a LED chip (light emitting diode). In this way, the electronic device may be a LED COB module.

The semiconductor chip arranged on the carrier may be an unpackaged chip or, respectively, a bare die. The semiconductor chip may furthermore comprise two front-side contacts to which bond wires may be connected.

The electronic device may comprise several semiconductor chips arranged on the carrier in the mounting area. Examples and details described above may correspondingly apply to such a configuration. It is, for example, possible that the several semiconductor chips are optoelectronic semiconductor chips, for example, radiation-emitting semiconductor chips such as LED chips. The carrier may comprise a mounting pad arranged on the first dielectric layer in the mounting area, and the several semiconductor chips may be arranged on the mounting pad. The carrier may alternatively comprise several separate mounting pads arranged on the first dielectric layer in the mounting area, wherein, on each of the several mounting pads, only one semiconductor chip may be arranged. Moreover, the carrier may comprise two partially covered contact layers arranged on the second dielectric layer and therefore two solder terminals and two contact areas. By electrical connection structures such as bond wires attached to the semiconductor chips and the two contact areas, the several semiconductor chips may both be electrically connected to each other as well as to the two contact areas.

Apart from the above-described components, the electronic device may comprise further components. As an example, the carrier may comprise a frame structure enclosing the mounting area, and the area enclosed by the frame structure may be filled up with an encapsulation or, respectively, embedding material. In this way, the semiconductor chip or the several semiconductor chips may be encapsulated.

The embedding material may be a transparent material. Alternatively, the embedding material may comprise a transparent material and embedded conversion particles for at least partially converting light radiation generated by the semiconductor chip(s). It is also possible that the semiconductor chip(s) comprise(s) a conversion layer to at least partially convert light radiation.

We also provide a method of producing an electronic device. The electronic device is configured as described above or, respectively, according to one or several of the above-described examples. In the method, a first dielectric layer and a second dielectric layer are provided. The thermal conductivity of the first dielectric layer exceeds the thermal conductivity of the second dielectric layer. The second dielectric layer is arranged on the first dielectric layer so that a carrier is produced, wherein the carrier comprises a mounting area in which the first dielectric layer is not covered by the second dielectric layer. The method further comprises providing a solder terminal arranged on the second dielectric layer, and arranging a semiconductor chip on the carrier in the mounting area.

In the method, the above-mentioned steps may be carried out in the indicated order. The electronic device produced according to the method may provide an effective removal of heat during operation and may be reliably contacted by soldering. In this regard, the semiconductor chip is arranged on the carrier in the mounting area in which the first dielectric layer with the higher thermal conductivity is not covered by the second dielectric layer. Consequently, heat produced during operation of the semiconductor chip may be efficiently transferred away from the semiconductor chip via the first dielectric layer. The solder terminal to which a wire may be connected by soldering is arranged on the second dielectric layer with the lower thermal conductivity. This makes it possible to provide and maintain an appropriate soldering temperature in the area of the solder terminal. As a consequence, the soldering process may be carried out with a high soldering quality, and therefore in an automated and cost-efficient manner.

In the following, further possible examples of the production method are described. In this regard, features and details described above with respect to the electronic device and its diverse constructions may also apply to the method.

The method may further comprise forming an opening in the second dielectric layer by which the mounting area of the carrier is provided. For this purpose, a punching or, respectively, blanking process may be carried out. Forming the opening may be carried out before arranging the second dielectric layer on the first dielectric layer.

The first dielectric layer may be provided with a metallic layer arranged on the first dielectric layer. The metallic layer is structured so that a mounting pad arranged on the first dielectric layer is provided. Furthermore, the semiconductor chip is arranged on the mounting pad. By the mounting pad, the semiconductor chip may be reliably attached to the carrier, and heat produced when operating the semiconductor chip may be efficiently transferred from the semiconductor chip to the first dielectric layer.

Structuring the metallic layer located on the first dielectric layer to provide the mounting pad may be carried out before arranging the second dielectric layer on the first dielectric layer. In this respect, arranging the second dielectric layer on the first dielectric layer may be carried out such that the mounting pad is not covered by the second dielectric layer. When an opening is formed in the second dielectric layer as described above, the second dielectric layer may be arranged on the first dielectric layer such that the mounting pad is located within the opening. The metallic layer arranged on the first dielectric layer may, for example, be a copper layer. It is furthermore possible to carry out a plating process, for example, after arranging the second dielectric layer on the first dielectric layer. In this way, the mounting pad may be additionally provided with a metallic plating.

The first dielectric layer may be provided with a metal base layer on which the first dielectric layer is arranged. The metal base layer may act as a heat sink of the produced electronic device. It is furthermore possible to arrange the electronic device or, respectively, the metal base layer of the same on an additional heat sink.

The second dielectric layer may be provided with a metallic layer arranged on the second dielectric layer. The metallic layer is structured so that a contact layer arranged on the second dielectric layer is provided. Moreover, a covering layer is formed that partially covers the contact layer so that the solder terminal is provided by a region of the contact layer not covered by the covering layer. By the covering layer, impairment of the contact layer like, for example, corrosion may be suppressed.

When an opening is formed in the second dielectric layer as described above, the opening may be also formed in the metallic layer arranged on the second dielectric layer.

The semiconductor chip may be electrically connected to the solder terminal in a suitable manner. In this respect, the covering layer may be formed such that the contact layer comprises a further region not covered by the covering layer, and may provide a contact area. Furthermore, a step of establishing an electrical connection between the contact area and the semiconductor chip may be carried out. This may, for example, be realized by performing a wire bonding process in which a bond wire is applied and attached to the contact area and to the semiconductor chip.

Structuring the metallic layer located on the second dielectric layer to provide the contact layer may be carried out before arranging the second dielectric layer on the first dielectric layer. Forming the covering layer may be carried out after arranging the second dielectric layer on the first dielectric layer. The metallic layer and thus the contact layer may, for example, be a copper layer. By the above-mentioned plating process, which may be carried out after arranging the second dielectric layer on the first dielectric layer or, respectively, after forming the covering layer, it is furthermore possible to additionally provide the solder terminal and the contact area with a metallic plating.

A further solder terminal may be arranged on the second dielectric layer. Consequently, the carrier of the electronic device produced in the method may comprise two solder terminals arranged on the second dielectric layer to which wires may be connected by soldering. The two solder terminals may constitute a cathode terminal and an anode terminal of the electronic device.

Examples described above and relating to a solder terminal may correspondingly apply to the two solder terminals. Accordingly, the second dielectric layer may be provided with a metallic layer arranged on the second dielectric layer, and the metallic layer may be structured so that two separate contact layers arranged on the second dielectric layer may be provided. By forming a common covering layer or two separate covering layers that partially cover(s) the two contact layers, two solder terminals may be provided by respective uncovered regions of the contact layers. Moreover, two contact areas may be provided by other respective uncovered regions of the two contact layers. By the above-mentioned plating process that may be carried out after forming the covering layer(s), the solder terminals and the contact areas may be additionally provided with a metallic plating. Furthermore, electrical connection structures such as bond wires may be attached to the two contact areas and to the semiconductor chip.

The electronic device produced in the method may be an optoelectronic device, for example, an optoelectronic device that generates light radiation. With respect to this, the semiconductor chip may correspondingly be an optoelectronic semiconductor chip or, respectively, a radiation-emitting semiconductor chip such as a LED chip.

It is furthermore possible to arrange several semiconductor chips, for example, radiation-emitting semiconductor chips on the carrier in the mounting area. In this regard, a mounting pad may be provided by structuring a metallic layer arranged on the first dielectric layer as described above, and the several semiconductor chips may be arranged on the mounting pad. It is also possible to structure a metallic layer arranged on the first dielectric layer such that several separate mounting pads are provided, and to arrange the several semiconductor chips on the several mounting pads. By carrying out a plating process, the mounting pad(s) may be additionally provided with a metallic plating. Moreover, two partially covered contact layers and therefore two solder terminals and two contact areas may be formed on the second dielectric layer and provided with a metallic plating as described above, and electrical connection structures such as bond wires may be attached to the two contact areas and the semiconductor chips.

The production method may comprise further method steps. It is, for example, possible to form a frame structure enclosing the mounting area on the carrier, and fill up the area enclosed by the frame structure with an encapsulation or, respectively, embedding material. In this way, the semiconductor chip or, respectively, the several semiconductor chips may be encapsulated.

It is furthermore possible to carry out the method such that an assemblage of several connected electronic devices is produced. Afterwards, the assemblage may be singularized into separate electronic devices. In this regard, layers and structures such as the first and the second dielectric layer, the solder terminals and the like may be provided and formed with dimensions and/or quantities matched with the several electronic devices to be produced.

The configurations and features described above may be realized individually or in any combination, except for, for example, cases of clear dependencies or contradicting alternatives.

The accompanying schematic drawings are included to provide a further understanding and are incorporated into and constitute a part of this specification. The drawings illustrate examples and together with the description serve to explain principles of our devices and methods. Other examples and many of the intended advantages will be readily appreciated as they will be better understood by reference to the following detailed description.

The following schematic figures serve to describe an electronic device 100 and a corresponding method of producing the same. The electronic device 100 is realized in the form of a so-called chip-on-board module (COB) comprising a carrier 105 and semiconductor chips 140 arranged on the same. The electronic device 100 may be an optoelectronic device that generates light radiation.

The figures may not be true to scale. In this sense, components and structures shown in the figures may be scaled up or reduced in size to provide a better understanding.

Figure 6:
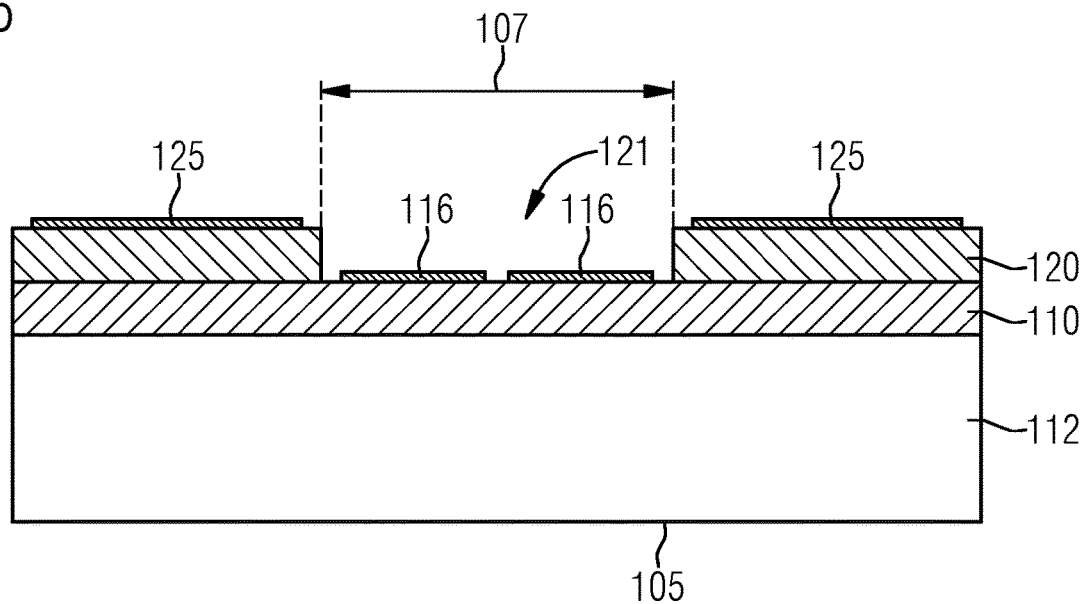
Figure 7:
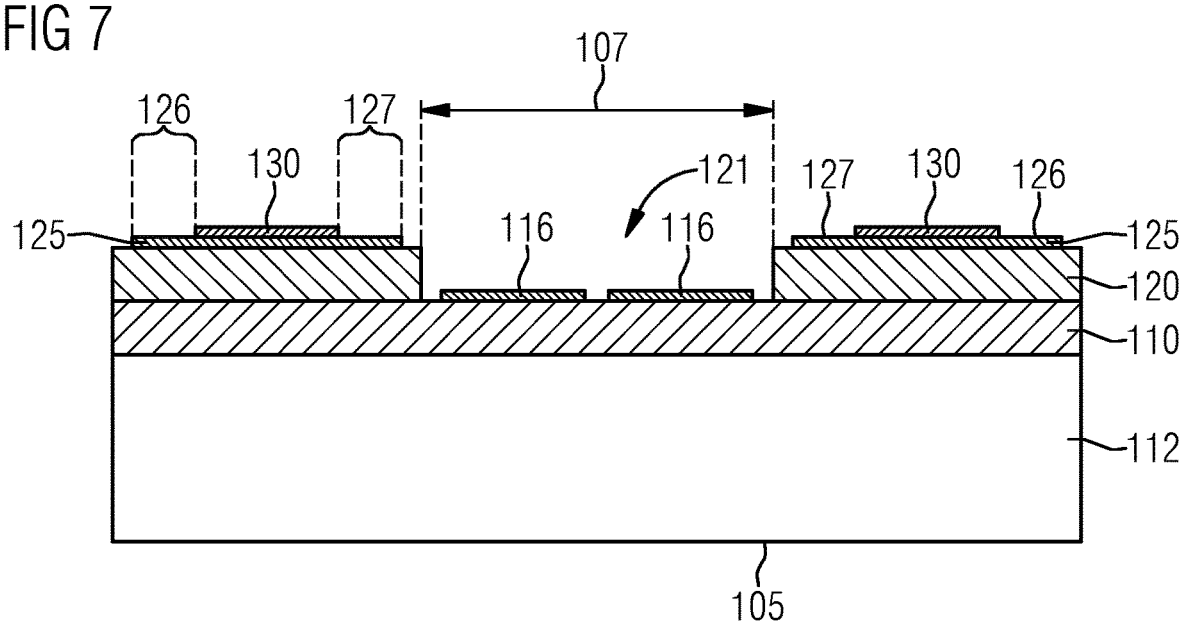
Figure 8:
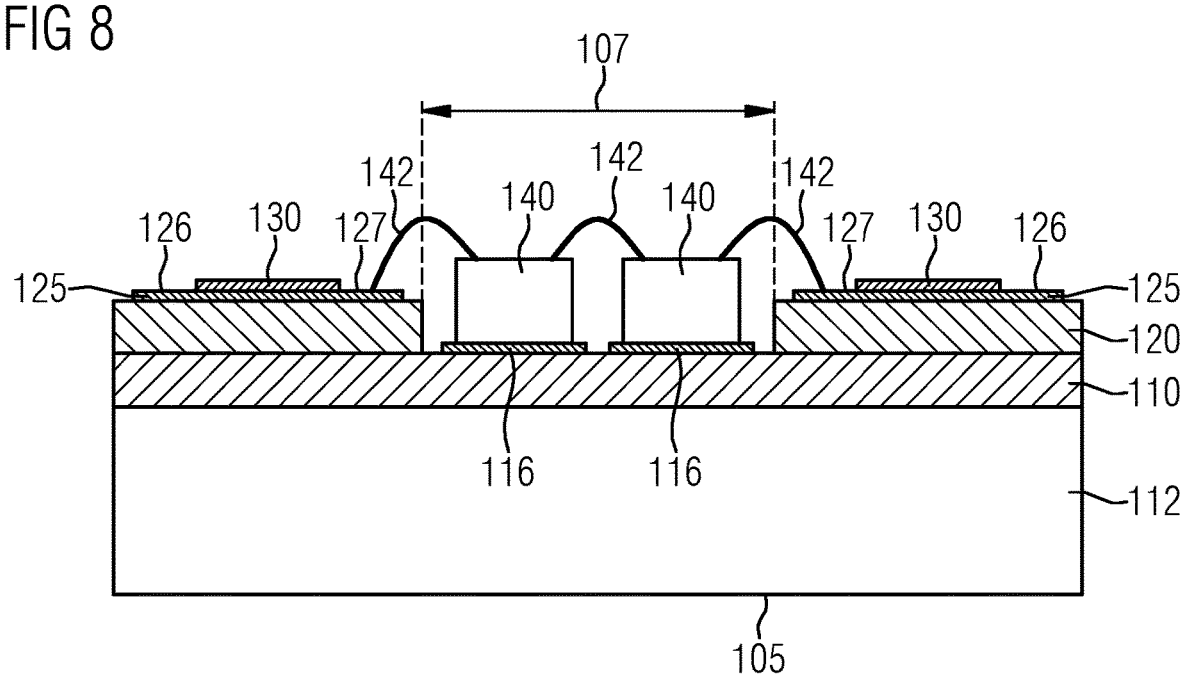
FIGS. 8 and 9 show fabrication of an electronic device, wherein semiconductor chips are arranged on the carrier and an electrical wiring and an encapsulation are formed.
Figure 9:
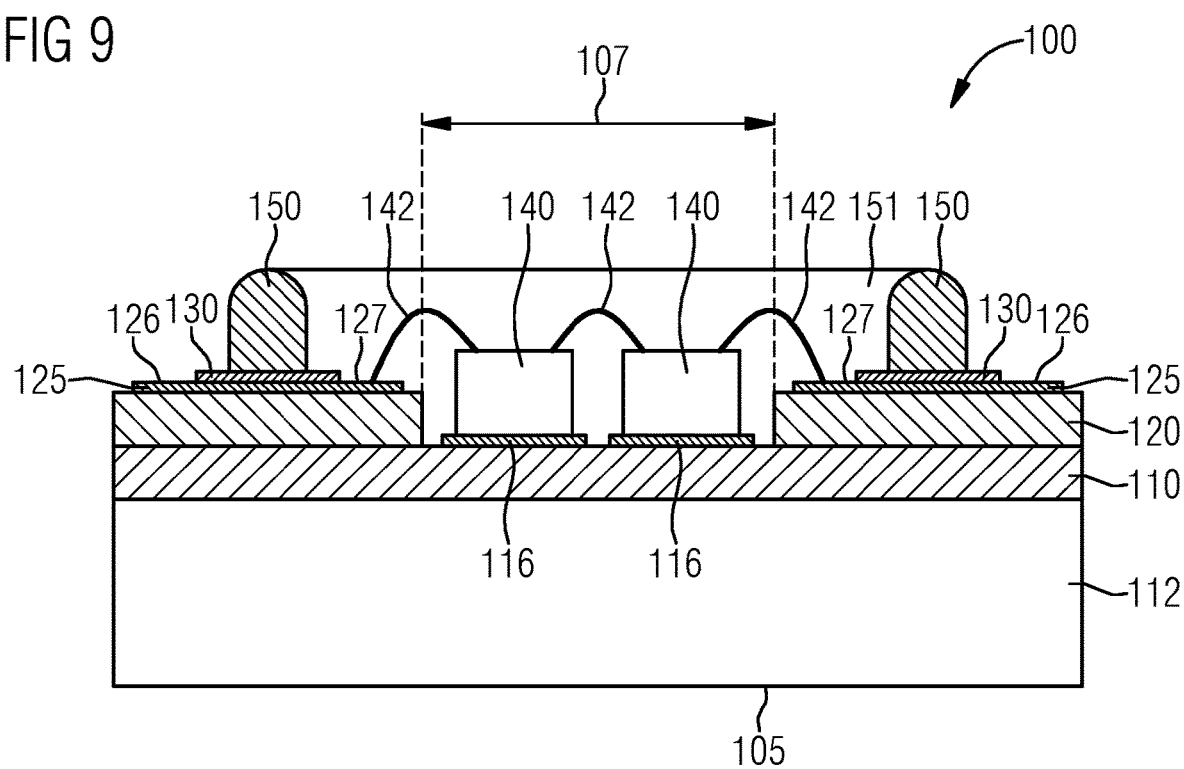

FIGS. 1 to 9 show steps of a possible method of producing an electronic device 100. In the figures, the method is illustrated by sectional views. FIGS. 1 to 7 illustrate fabrication of a respective carrier 105 of the electronic device 100, and FIGS. 8 and 9 illustrate further processes carried out to fabricate the electronic device 100.

The method may be carried out such that an assemblage of several connected electronic devices 100 is produced and subsequently singularized into separate electronic devices 100. In this respect, the figures may be regarded as showing conditions in the area of only one of the electronic devices 100 to be produced, and the figures and the corresponding description may apply to all of the jointly produced electronic devices 100.

In the method, a first dielectric layer 110 or, respectively, a layer stack comprising the first dielectric layer 110 is provided as shown in FIG. 1. Apart from the first dielectric layer 110, the layer stack comprises a metallic layer 114 arranged on the dielectric layer 110. The first dielectric layer 110 is furthermore arranged on a metal base layer 112. In the produced electronic device 100, the metal base layer 112 may act as a heat sink.

The first dielectric layer 110 may comprise a dielectric material with a relatively high thermal conductivity. The thermal conductivity of the dielectric material of the first dielectric layer 110 is higher than the thermal conductivity of a dielectric material of a second dielectric layer 120 also applied in the method, as described in more detail further below. The first dielectric layer 110 may, for example, comprise a resin-based composite material.

The metallic layer 114 located on the first dielectric layer 110 may, for example, be a copper layer. The metal base layer 112 may, for example, be an aluminum layer. Providing the layer stack shown in FIG. 1 may comprise bonding the layers 110, 112, 114 by a lamination process. With regard to this, the layer stack shown in FIG. 1 may represent a copper clad laminate with a metal backing.

As further shown in FIG. 2, the metallic layer 114 is subsequently structured so that separate mounting pads 116 arranged on the first dielectric layer 110 are provided. Structuring the metallic layer 114 to form the mounting pads 116 may be carried out by an etching process in which an appropriate etching mask is applied (not depicted).

On each of the mounting pads 116, a respective semiconductor chip 140 is arranged at a later stage of the fabrication method (see FIG. 8). Consequently, structuring the metallic layer 114 to form the mounting pads 116 is carried out such that the number of the formed mounting pads 116 corresponds to the designated number of the semiconductor chips 140 provided for the electronic device 100. Apart from the two mounting pads 116 shown in the sectional view of FIG. 2, a different or, respectively, greater number of mounting pads 116 may be formed. The mounting pads 116 may be also referred to as die attach pads.

With respect to fabrication of an assemblage of connected electronic devices 100, the layer stack shown in FIG. 1 may be provided with appropriate lateral dimensions. Moreover, a respective number of mounting pads 116 may be formed for each of the jointly produced electronic devices 100 by structuring the metallic layer 114.

Figure 3:
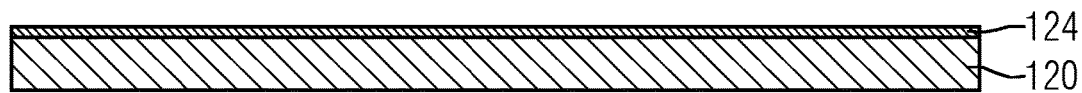

The method furthermore comprises providing a second dielectric layer 120 or, respectively, a layer stack comprising the second dielectric layer 120, as shown in FIG. 3. Apart from the second dielectric layer 120, the layer stack comprises a metallic layer 124 arranged on the dielectric layer 120.

The second dielectric layer 120 may comprise a dielectric material with a relatively low thermal conductivity. As indicated above, the thermal conductivity of the dielectric material of the second dielectric layer 120 is lower than the thermal conductivity of the dielectric material of the first dielectric layer 110. Similar to the first dielectric layer 110, the second dielectric layer 120 may, for example, comprise a resin-based composite material.

The metallic layer 124 located on the second dielectric layer 120 may, for example, be a copper layer. Providing the layer stack shown in FIG. 3 may comprise bonding the layers 120, 124 by a lamination process. With respect to this, the layer stack shown in FIG. 3 may represent a copper clad laminate.

Figure 4:
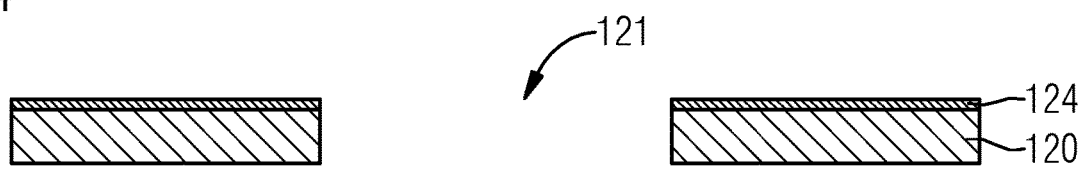

In a further method step, an opening 121 is formed in the second dielectric layer 120 or, respectively, in the layer stack comprising the second dielectric layer 120 and the metallic layer 124 as shown in FIG. 4. The opening 121 may, for example, comprise a circular outline when viewed from above (not depicted). In the produced carrier 105, the opening 121 provides a respective mounting area 107 to receive and mount semiconductor chips 140 (see FIGS. 7, 8). Forming the opening 121 may, for example, be carried out by a punching process.

As further illustrated in FIG. 5, the metallic layer 124 is subsequently structured so that two separate contact layers 125 arranged on the second dielectric layer 120 are provided. By the contact layers 125, solder pads 126 and contact areas 127 are provided at a later stage of the production method (see FIG. 7). The contact layers 125 may, as the case may be, partially enclose the opening 121 when viewed from above (not depicted). Structuring the metallic layer 124 to form the separate contact layers 125 may be carried out by an etching process in which an appropriate etching mask is applied (not depicted).

With respect to fabrication of an assemblage of connected electronic devices 100, the layer stack shown in FIG. 3 may be provided with appropriate lateral dimensions. Moreover, punching and structuring the metallic layer 124 may be carried out such that an opening 121 and two separate contact layers 125 are respectively formed for each of the jointly produced electronic devices 100.

The above-described method steps carried out with respect to the second dielectric layer 120 may also be carried out in a reverse order. Consequently, it is possible to first form the contact layers 125 by structuring the metallic layer 124 and subsequently form the opening(s) 121.

Figure 2:
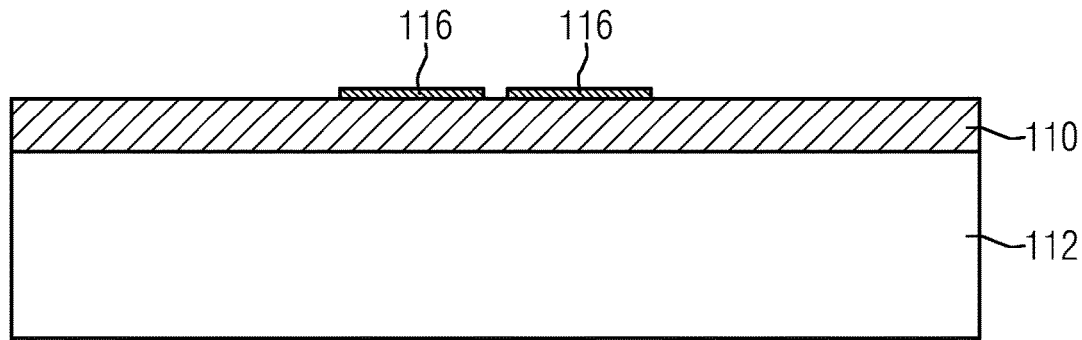
Figure 5:
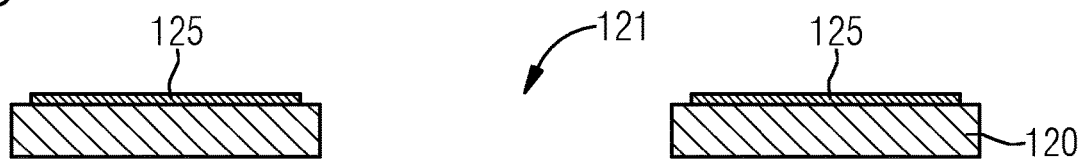

Fabricating the carrier 105 of the electronic device 100 furthermore comprises bonding the previously formed layer stacks, i.e. the layer stack 110, 112, 116 of FIG. 2 and the layer stack 120, 125 of FIG. 5, as shown in FIG. 6. For this procedure, the second dielectric layer 120 comprising the contact layers 125 located thereon is arranged on the first dielectric layer 110, and the two dielectric layers 110, 120 are bonded to each other. In this way, the second dielectric layer 120 which partially covers the first dielectric layer 110 constitutes a top, and the first dielectric layer 110 constitutes a bottom dielectric layer of the carrier 105. Moreover, the opening 121 provides the above-mentioned mounting area 107. In the mounting area 107, the first dielectric layer 110 is not covered by the second dielectric layer 120.

As also shown in FIG. 6, the second dielectric layer 120 is arranged on the first dielectric layer 110 such that the mounting pads 116 are located within the opening 121 and thus within the mounting area 107 constituted of the opening 121. The second dielectric layer 120 is furthermore arranged on the first dielectric layer 110 with a side opposite to a side on which the contact layers 125 are located.

To bond the dielectric layers 110, 120, a lamination process may be carried out. The lamination process may be conducted with the application of pressure and heat. When the dielectric layers 110, 120 comprise resin-based dielectric materials as stated above, such materials may melt at the boundary of the layers 110, 120. Bonding the layers 110, 120 may occur during subsequent hardening. It is furthermore possible to apply an additional adhesive in between the layers 110, 120 (not depicted).

With respect to fabrication of an assemblage of connected electronic devices 100, a respective carrier assemblage of connected carriers 105 may be formed by laminating corresponding layer stacks, i.e. the layer stack 110, 112, 116 and the layer stack 120, 125, wherein the layer stacks are produced with appropriate lateral dimensions and appropriate quantities of mounting pads 116, openings 121 and contact layers 125 for the jointly produced electronic devices 100. Arranging and laminating the layer stacks is carried out such that the mounting pads 116 are respectively located within the openings 121 and thus within the mounting areas 107 provided by the openings 121.

Fabricating the carrier 105 of the electronic device 100 furthermore comprises partially covering the two contact layers 125 as shown in FIG. 7. This may be done by forming a common covering layer 130 or two separate covering layers 130 assigned to the contact layers 125. Depending on the configuration, the covering layer(s) 130 may be arranged not only on the contact layers 125 as shown in the sectional view of FIG. 7, but also on the dielectric layer 120 (not depicted). Moreover, the covering layer(s) 130 may, as the case may be, enclose or partially enclose the opening 121 and thus the mounting area 107 when viewed from above (not depicted). The covering layer(s) 130 may comprise an insulating material and may constitute a solder mask structure of the carrier 105. By the covering layer(s) 130, the two contact layers 125 may be partially protected so that an impairment of the contact layers 125 may be suppressed.

As shown in FIG. 7, the partially covered contact layers 125 comprise regions 126, 127 not covered by the covering layer(s) 130. Each of the contact layers 125 comprises an uncovered region 126 serving as a solder terminal or, respectively, solder pad 126 and another region 127 serving as a contact area 127. The solder pads 126 to which wires 160 may be connected by soldering (see FIG. 10) are used to electrically contact the produced electronic device 100. The two solder pads 126 constitute a cathode terminal and an anode terminal of the electronic device 100. The contact areas 127 to which bond wires 142 may be connected (see FIG. 8) are used to provide electrical connections with the semiconductor chips 140 of the electronic device 100. This is described in more detail further below.

With respect to fabrication of an assemblage of connected electronic devices 100, a respective number of covering layers 130 may be formed on the carrier assemblage for the jointly produced electronic devices 100 so that each contact layer 125 comprises uncovered region 126, 127 constituting a solder pad 126 and a contact area 127.

After forming the covering layer(s) 130 and therefore providing the solder pads 126 and the contact areas 127, it is, for example, possible to carry out a plating process in which the solder terminals 126, the contact areas 127 and the mounting pads 116 are provided with an additional metallic plating (not depicted). The metallic plating may, for example, comprise different metallic materials or, respectively, a metallic layer stack such as NiPdAu. By the metallic plating, effects like an enhanced solderability, an enhanced connectivity to bond wires 142 and an enhanced reflectivity may be provided.

Method steps described with regard to fabrication of the carrier 105 or, respectively, the carrier assemblage shown in FIGS. 6, 7 may also be carried out in a different order. In this respect, it is possible to first cover the contact layers 125 with the covering layer(s) 130, and subsequently arrange the second dielectric layer 120 on the first dielectric layer 110. Afterwards, the plating process may be carried out. Furthermore, the carrier 105 shown in FIG. 7 comprising the metal base layer 112 may be also referred to as metal core printed circuit board (MCPCB).

Afterwards, further processes are carried out to fabricate the electronic device 100. This includes arranging unpackaged semiconductor chips 140, also referred to as bare dies, on the carrier 105 in the mounting area 107 as shown in FIG. 8. The semiconductor chips 140 are arranged on the mounting pads 116. On each of the mounting pads 116, a respective semiconductor chip 140 is mounted. To fix the semiconductor chips 140 on the mounting pads 116, a bonding material such as an adhesive may be applied (not depicted).

As indicated above, the carrier 105 may be produced with a number of mounting pads 116 which is different from or, respectively, greater than the two mounting pads 116 shown in the sectional view of FIG. 8. This also applies to the number of semiconductor chips 140 mounted on the carrier 105 in the mounting area 107 which may differ or, respectively, exceed the depicted two semiconductor chips 140.

The semiconductor chips 140 shown in FIG. 8 may be optoelectronic semiconductor chips 140, for example, radiation-emitting semiconductor chips such as LED chips (light emitting diode). Such semiconductor chips 140 may be configured as sapphire chips. In this respect, the electronic device 100 to be produced in the method may be a an optoelectronic device that generates light radiation.

Each semiconductor chip 140 comprises two front-side contacts to which bond wires 142 may be attached as indicted in FIG. 8. It is the front side by which a light radiation generated when operating the semiconductor chips 140 may be substantially emitted. The semiconductor chips 140 may be manufactured in a known manner and may comprise, in addition to the front-side contacts, components such as a semiconductor layer sequence with an active zone that generates light radiation, a subsequently formed or mounted conversion layer for at least partially converting the generated light radiation as the case may be (not depicted).

The bond wires 142 depicted in FIG. 8 are provided and attached to the front-side contacts of the semiconductor chips 140 and to the contact areas 127 of the carrier 105 in a wire bonding process carried out after arranging the semiconductor chips 140 on the carrier 105. In this process, electrical connections are established between semiconductor chips 140 and the contact areas 127 as well as between semiconductor chips 140 themselves by bond wires 142. In this way, semiconductor chips 140 are also electrically connected with the solder pads 126.

FIG. 8 depicts a possible electrical interconnection of semiconductor chips 140 in the form of a series connection. As described above, the electronic device 100 may be formed with a greater number of mounting pads 116 and therefore a greater number of semiconductor chips 140. In this regard, various non-depicted electrical interconnections may be realized by the applied bond wires 142.

It is, for example, possible to provide one series connection including a plurality of (i.e. more than two) semiconductor chips 140 wherein only the two semiconductor chips 140 located at the ends of the series connection are connected to the contact areas 127. Another example are several series connections of semiconductor chips 140, wherein the semiconductor chips 140 arranged at the ends of the series connections are respectively connected to the contact areas 127. Apart from that, it is, for example, also possible to consider parallel connections or mixed parallel and series connections of semiconductor chips 140 arranged in the mounting area 107.

With regard to fabrication of an assemblage of connected electronic devices 100, semiconductor chips 140 are arranged on the carrier assemblage in all of the mounting areas 107, and respective electrical connections are established by carrying out a wire bonding process.

Subsequently, further processes are carried out to produce the electronic device 100 in which further structures are formed on the carrier 105 as shown in FIG. 9. This includes forming a frame structure 150 on the carrier 105 enclosing the mounting area 107 and thus the semiconductor chips 140 arranged in this area 107. The frame structure 150 may comprise, similar to the opening 121 and thus the mounting area 107, a circular outline when viewed form above (not depicted).

The frame structure 150 may, for example, be formed from a silicone material. The frame structure 150 may be arranged not only on the covering layer(s) 130 as shown in the sectional view of FIG. 9, but also, as the case may be, on the dielectric layer 120 and/or on the contact layers 125.

Moreover, the area enclosed by the frame structure 150 is subsequently filled up with an embedding material 151, as also shown in FIG. 9. In this way, the semiconductor chips 140 and bond wires 142 may be encapsulated and therefore protected from external influences. The embedding material 151 may, for example, be a transparent material such as a silicone material. In an alternative configuration, the embedding material 151 may comprise a transparent matrix material such as a silicone material and phosphor particles embedded in the transparent matrix material for at least partially converting light radiation generated by the semiconductor chips 140 (not depicted).

With respect to fabrication of an assemblage of connected electronic devices 100, frame structures 150 are formed on the carrier assemblage, each frame structure 150 enclosing a respective mounting area 107, and the areas enclosed by the frame structures 150 are filled up with the embedding material 151.

Afterwards, the assemblage may be singularized into individual separate electronic devices 100, each device 100 having a configuration as shown in FIG. 9. In this process, the assemblage may be divided, for example, by sawing (not depicted).

The electronic device 100 shown in FIG. 9 and produced according to the above-described method comprises two dielectric layers 110, 120, wherein the second dielectric layer 120 partially covers the first dielectric layer 110, and wherein the thermal conductivity of the first dielectric layer 110 exceeds the thermal conductivity of the second dielectric layer 120. This configuration makes it possible to provide efficient removal of heat during operation of the electronic device 100 as well as to promote a soldering process carried out to contact the electronic device 100.

The semiconductor chips 140 of the electronic device 100 are arranged on the carrier 105 in the mounting area 107. In this area 107, the first dielectric layer 110 with the higher thermal conductivity is not covered by the second dielectric layer 120, and the semiconductor chips 140 are arranged on the mounting pads 116 located on the first dielectric layer 110. Consequently, heat produced during operation of the semiconductor chips 140 may be efficiently conducted away from the semiconductor chips 140. The heat may be efficiently transferred to the first dielectric layer 110 via the mounting pads 116, and via the first dielectric layer 110 to the metal base layer 112. The metal base layer 112 may act as a heat sink. Moreover, it is possible to arrange the electronic device 100 or, respectively, the metal base layer 112 of the carrier 105 on an additional heat sink (not depicted). In this way, a heat transfer from the metal base layer 112 to the additional heat sink may occur, thus further promoting efficient removal of heat during operation of the electronic device 100 (not depicted).

Figure 10:
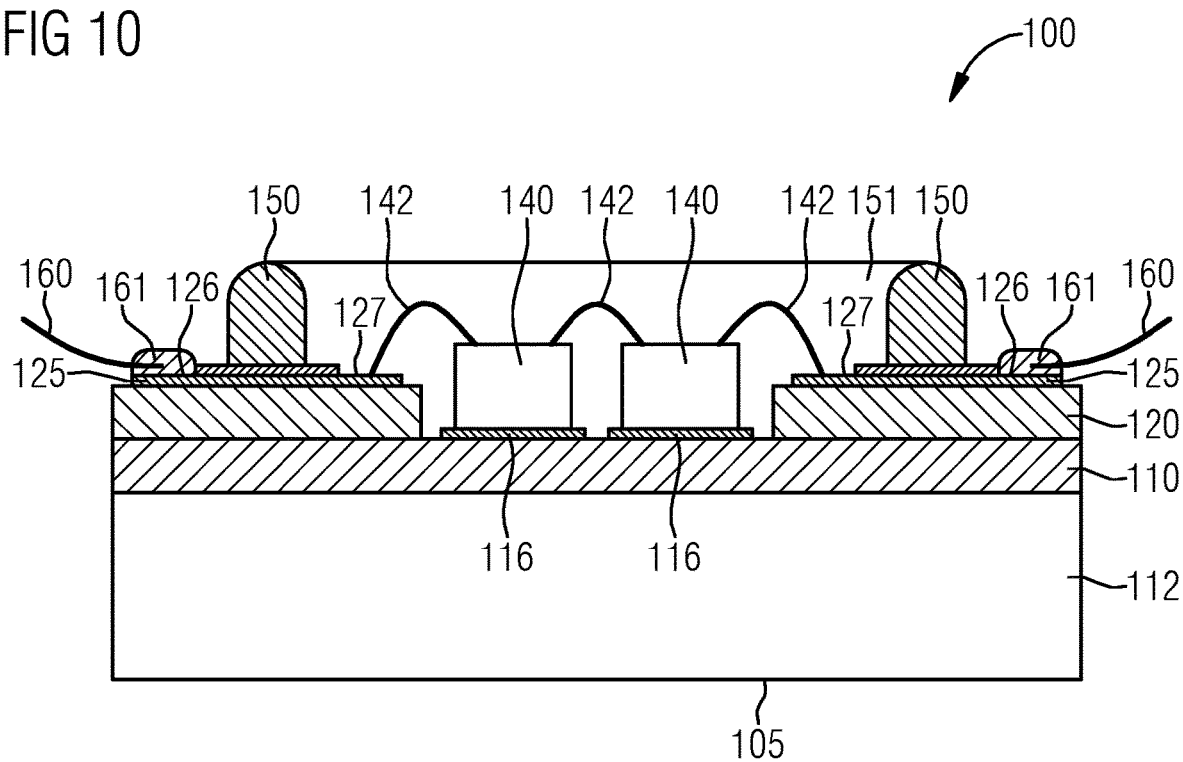
FIG. 10 shows the electronic device including wires connected to the solder pads.

To contact the electronic device 100 so that electrical energy may be supplied to the electronic device 100 for operating the same, respective wires 160 may be connected to the solder pads 126 by carrying out a soldering process, as shown in FIG. 10. As described above, the solder pads 126 constitute a cathode terminal and an anode terminal of the electronic device 100. In the soldering process, a solder 161 is used so that an electrical and also a mechanical connection is established between the wires 160 and the solder pads 126. In this way, the wires 160 are also electrically connected to the contact areas 127 via the contact layers 125, and therefore to the semiconductor chips 140 via the bond wires 142.

The soldering process comprises melting the solder 161 provided in the area of the solder pads 126 by the application of heat. For this purpose, a soldering device or, respectively, a soldering iron may be used (not depicted). Subsequently, cooling down results in hardening the solder 161 so that respective solder joints are formed.

The solder pads 126 are located on the second dielectric layer 120 with the lower thermal conductivity. Due to this, a removal and transfer of heat to the metal base layer 112 and, as the case may be, to an additional heat sink is suppressed or, respectively, lowered in the area of the solder pads 126, thus making it possible to reliably provide and maintain an appropriate soldering temperature at the solder pads 126. As a consequence, the soldering process may be carried out with a high process quality, and reliable and stable solder joints may be formed. The soldering process may be furthermore carried out in an automated and therefore cost-efficient manner. Moreover, the presence of stable solder joints allows for high efficiency when operating the electronic device 100.

With respect to the dielectric layers 110, 120, the following numerical data for thermal conductivities may apply so that an effective removal of heat during operation of the electronic device 100 as well as soldering with a high quality is possible with a high reliability. The first dielectric layer 110 may, for example, comprise a thermal conductivity with a minimum value of 10 W/mK, i.e., for example, a thermal conductivity of 10 W/mK to 20 W/mK. The second dielectric layer 120 may comprise a thermal conductivity with a maximum value of 5 W/mK. The thermal conductivity of the second dielectric layer may, for example, be smaller than 2 W/mK or smaller than 1 W/mK.

The above-described electronic device and the method of producing the same explained with reference to the figures represent possible examples. In addition to the examples described and illustrated, further examples that may comprise modifications and/or combinations of the features described are possible.

In this respect, the above-mentioned materials and numerical data are examples that may be replaced by other materials and specifications. It is, for example, possible to apply dielectric materials for the first and second dielectric layer 110, 120 comprising thermal conductivities from the following group: 1.3 W/mK; 2.0 W/mK; 2.2 W/mK; 2.7 W/mK; 3.0 W/mK. In this respect, it may, for example, be considered that the first dielectric layer 110 comprises a thermal conductivity of 3.0 W/mK, and that the second dielectric layer 120 comprises a thermal conductivity of 1.3 W/mK.

Instead of providing a respective mounting pad 116 for each of the semiconductor chips 140, it is also possible to provide one mounting pad 116 (per produced electronic device 100) on which several semiconductor chips 140 may be arranged.

Instead of semiconductor chips 140 comprising two front-side contacts, other semiconductor chips, for example, comprising a front-side contact and a back-side contact or comprising two back-side contacts may be applied. Such semiconductor chips may be arranged on mounting pads 116 located in a mounting area 107 of a carrier 105 and may be mechanically bonded and electrically connected to the mounting pads 116 by an electrically conductive bonding material such as an electrically conductive adhesive. In such configurations, the mounting pads 116 may be also used to provide electrical connections between semiconductor chips and contact areas and/or between semiconductor chips themselves. In this regard, bond wires 142 may be connected to the mounting pads 116 so that, for example, mounting pads 116 and semiconductor chips and/or mounting pads 116 and contact areas 127 may be electrically connected.

Moreover, an electronic device may not only be realized with radiation-emitting semiconductor chips 140. Instead of radiation-emitting semiconductor chips 140, other types of semiconductor chips may be used. An example are radiation-receiving semiconductor chips. Moreover, apart from optoelectronic semiconductor chips, other types of semiconductor chips may be considered.

Another possible configuration is an electronic device comprising only one semiconductor chip arranged on a carrier or, respectively, on a mounting pad 116 of the same.

While our devices and methods have been described in detail with reference to specific examples thereof, it will be apparent to those skilled in the art that various changes and modifications can be made therein without departing from the spirit and scope thereof. Accordingly, this disclosure covers modifications and variations of our devices and methods provided they come within the scope of the appended claims and their equivalents.

The invention claimed is:

1. An electronic device comprising a carrier and a semiconductor chip,
    wherein the carrier comprises a first dielectric layer and a second dielectric layer,
    a thermal conductivity of the first dielectric layer exceeds a thermal conductivity of the second dielectric layer,
    the second dielectric layer is arranged on the first dielectric layer and partially covers the first dielectric layer,
    the semiconductor chip is arranged on the carrier in a mounting area in which the first dielectric layer is not covered by the second dielectric layer,
    and the carrier comprises a solder terminal for electrical contacting arranged on the second dielectric layer.

2. The electronic device according to claim 1, wherein the second dielectric layer comprises an opening by which the mounting area is provided.

3. The electronic device according to claim 1, wherein the carrier comprises a mounting pad arranged on the first dielectric layer in the mounting area, and the semiconductor chip is arranged on the mounting pad.

4. The electronic device according to claim 1, wherein the carrier comprises a metal base layer on which the first dielectric layer is arranged.

5. The electronic device according to claim 1, wherein the carrier comprises a contact layer arranged on the second dielectric layer and a covering layer partially covering the contact layer, and the solder terminal is provided by a region of the contact layer not covered by the covering layer.

6. The electronic device according to claim 1, wherein the carrier comprises a further solder terminal arranged on the second dielectric layer for electrical contacting.

7. The electronic device according to claim 1, satisfying at least one of:
    the semiconductor chip is an optoelectronic semiconductor chip, or
    the electronic device comprises several semiconductor chips arranged on the carrier in the mounting area.

8. A method of producing the electronic device according to claim 1, comprising:
    providing a first dielectric layer;
    providing a second dielectric layer, wherein a thermal conductivity of the first dielectric layer exceeds a thermal conductivity of the second dielectric layer;
    arranging the second dielectric layer on the first dielectric layer so that a carrier is produced, wherein the carrier comprises a mounting area in which the first dielectric layer is not covered by the second dielectric layer;
    providing a solder terminal arranged on the second dielectric layer; and
    arranging a semiconductor chip on the carrier in the mounting area.

9. The method according to claim 8, further comprising forming an opening in the second dielectric layer by which the mounting area of the carrier is provided.

10. The method according to claim 8, wherein the first dielectric layer is provided with a metallic layer arranged on the first dielectric layer, the metallic layer is structured so that a mounting pad arranged on the first dielectric layer is provided, and the semiconductor chip is arranged on the mounting pad.

11. The method according to claim 8, wherein the first dielectric layer is provided with a metal base layer on which the first dielectric layer is arranged.

12. The method according to claim 8, wherein the second dielectric layer is provided with a metallic layer arranged on the second dielectric layer, the metallic layer is structured so that a contact layer arranged on the second dielectric layer is provided, and a covering layer is formed which partially covers the contact layer so that the solder terminal is provided by a region of the contact layer not covered by the covering layer.

13. An electronic device comprising a carrier and a semiconductor chip,
    wherein the carrier comprises a first dielectric layer and a second dielectric layer,
    a thermal conductivity of the first dielectric layer exceeds a thermal conductivity of the second dielectric layer,
    the second dielectric layer is arranged on the first dielectric layer and partially covers the first dielectric layer,
    the semiconductor chip is arranged on the carrier in a mounting area in which the first dielectric layer is not covered by the second dielectric layer,
    the carrier comprises a solder terminal for electrical contacting arranged on the second dielectric layer,
    the carrier comprises a contact layer arranged on the second dielectric layer,
    the carrier comprises a covering layer directly adjoining the contact layer and partially covering the contact layer,
    and the solder terminal is provided by a region of the contact layer which is not covered by the covering layer.

14. The electronic device according to claim 13, wherein the covering layer comprises an insulating material.

15. The electronic device according to claim 13,
    wherein the carrier comprises a contact area,
    the contact area is provided by a further region of the contact layer not covered by the covering layer, and
    an electrical connection structure is attached to the contact area and to the semiconductor chip such that the semiconductor chip is electrically connected to the solder terminal.

16. An electronic device comprising a carrier and a semiconductor chip, wherein the carrier comprises a first dielectric layer and a second dielectric layer, each of the first and the second dielectric layer is made of a resin-based composite material, a thermal conductivity of the first dielectric layer exceeds a thermal conductivity of the second dielectric layer, the second dielectric layer is arranged on the first dielectric layer and partially covers the first dielectric layer, the semiconductor chip is arranged on the carrier in a mounting area in which the first dielectric layer is not covered by the second dielectric layer, and the carrier comprises a solder terminal for electrical contacting arranged on the second dielectric layer.

17. The electronic device according to claim 1, wherein the first dielectric layer comprises a thermal conductivity with a minimum value of 10 W/mK, and the second dielectric layer comprises a thermal conductivity with a maximum value of 5 W/mK.

18. The electronic device according to claim 1, wherein the first dielectric layer comprises a thermal conductivity of 10 W/mK to 20 W/mK, and the second dielectric layer comprises a thermal conductivity below 2 W/mk or below 1 W/mk.

19. The electronic device according to claim 1, wherein the first and the second dielectric layer comprise thermal conductivities selected from the group consisting of:

1.3 W/mK; 2.0 W/mK, 2.2 W/mK, 2.7 W/mK and 3.0 W/mK.

20. The electronic device according to claim 1, wherein the first dielectric layer comprises a thermal conductivity of 3.0 W/mK, and the second dielectric layer comprises a thermal conductivity of 1.3 W/mK.

* * * * *